(12) United States Patent
Miura et al.

(10) Patent No.: US 7,247,929 B2
(45) Date of Patent: Jul. 24, 2007

(54) MOLDED SEMICONDUCTOR DEVICE WITH HEAT CONDUCTING MEMBERS

(75) Inventors: Shoji Miura, Nukata-gun (JP); Yoshimi Nakase, Anjo (JP)

(73) Assignee: DENSO CORPORATION, Kariya (JP)

( * ) Notice: Subject to any disclaimer, the term of this patent is extended or adjusted under 35 U.S.C. 154(b) by 101 days.

(21) Appl. No.: 10/808,567

(22) Filed: Mar. 25, 2004

(65) Prior Publication Data
US 2004/0195649 A1    Oct. 7, 2004

(30) Foreign Application Priority Data
Mar. 26, 2003    (JP)    ............... 2003-084434

(51) Int. Cl.
  *H01L 23/495*    (2006.01)
(52) U.S. Cl. .............. 257/675; 257/666; 257/712; 257/796
(58) Field of Classification Search ........ 257/712–713, 257/718–720, 666–677, 723, 181, 787, 796
See application file for complete search history.

(56) References Cited

U.S. PATENT DOCUMENTS

| | | | |
|---|---|---|---|
| 6,255,672 | B1 | 7/2001 | Yoshioka et al. |
| 6,542,365 | B2 | 4/2003 | Inoue |
| 6,845,012 | B2 | 1/2005 | Ohkouchi |
| 7,027,302 | B2 | 4/2006 | Inoue |
| 2003/0132530 | A1 | 7/2003 | Teshima et al. |
| 2005/0040515 | A1 | 2/2005 | Inoue et al. |
| 2006/0120047 | A1 | 6/2006 | Inoue |

FOREIGN PATENT DOCUMENTS

| | | |
|---|---|---|
| JP | A-08-078599 | 3/1996 |
| JP | A-10-79453 | 3/1998 |
| JP | A-2000-174180 | 6/2000 |
| JP | A-2002-164485 | 6/2002 |

OTHER PUBLICATIONS

Meriam-Webster Online Dictionary, www.m-w.com.*
First Office Action from Chinese Patent Office issued on Jul. 7, 2006 for the corresponding Chinese patent application No. 200410031258.4 (a copy and English translation thereof).

* cited by examiner

*Primary Examiner*—Monica Lewis
(74) *Attorney, Agent, or Firm*—Posz Law Group, PLC (57) ABSTRACT

A power element package includes a semiconductor chip, radiating members, a mold resin member, a lead terminal for control signals, and lead terminals for large electric current. On a heat accepting surface of the radiating member, an insulating layer and a conductive layer are disposed. The lead terminal for control signals is electrically connected with a gate of the semiconductor chip through the conductive layer. An emitter of the semiconductor chip is electrically connected through a solder connection member with a non-insulating portion of the heat accepting surface.

14 Claims, 6 Drawing Sheets

MOLDED SEMICONDUCTOR DEVICE WITH HEAT CONDUCTING MEMBERS

CROSS REFERENCE TO RELATED APPLICATIONS

This application is based on and incorporates herein by reference Japanese Patent Application No. 2002-84434 filed on Mar. 26, 2003.

FIELD OF THE INVENTION

The present invention relates to a semiconductor device used in a three-phase inverter circuit or the like.

BACKGROUND OF THE INVENTION

A semiconductor power element used in an inverter circuit for driving an automobile motor is available as a power element package integrated with a mold resin, where a power element is sandwiched between heat sink plates of radiating members (refer to JP-A-2001-156225 or USP-2003/0132530 A1). The power element includes an IGBT (Insulated Gate Bipolar Transistor) as a typical power element. The power element of the IGBT is sandwiched between the heat sink plates while an emitter or collector of the power element is connected using solder with the heat sink plate directly or via a spacer. Here, the heat sink plate functions as a path of a large electric current. A gate (control electrode) of the power element is electrically connected with a lead terminal for control signals that is outwardly protruding from the mold resin via a bonding wire. The power element is thus constructed as a power element package. A plurality of the power element packages is assembled to constitute a module of inverter circuit.

In addition, increase of the dimensions of the heat sink plate is proposed to further reduce thermal resistance of the power element package. This proposal involves problem in connection structure where a power element is connected using the boding wire, as explained above, with a lead terminal for control signals to the power element. Here, to maintain connection reliability a wire length is required to be at most 10 mm. The wire length of more than 10 mm potentially involves, during the resin molding, mutual contact between the adjoining wires or breakage of the wire. The connection structure using the bonding wire is therefore improper for increasing the dimensions of the heat sink.

SUMMARY OF THE INVENTION

It is an object of the present invention to a resin molded semiconductor device suitable for increased dimensions of a heat sink.

To achieve the above object, a semiconductor device is provided with the following. An element of a semiconductor switching element is provided such that the element includes two of a first and second surfaces. A first electrode is exposed on the first surface; a second electrode is exposed on the second surface; and a control electrode is exposed on a control-electrode-exposing surface that is one of the first and second surfaces. Two radiating members are provided such that the element is disposed between the two radiating members. The two radiating members are electrically connected with the first and second electrodes, respectively. Each of the two radiating members has an inward surface that is closer to the element than the other surface. A mold resin member fills a space between the two radiating members. An insulating layer is formed on at least one of the inward surfaces of the two radiating members. A conductive layer is formed on the insulating layer and electrically connected with the control electrode and an input portion protruding from the mold resin member. Further, one of the first and second electrodes is electrically connected with a non-insulating portion of the inward surface where the insulating layer is formed, wherein no insulating layer is formed on the non-insulating portion.

This structure enables a semiconductor switching element of a semiconductor package to be cooled from both top and bottom surfaces. In particular, in this structure, an insulating layer is formed on an inward surface of a radiating member, and a conductive layer is then formed on the insulating layer. This conductive layer functions as an intermediate wiring that exists between the semiconductor chip and a signal terminal as a lead terminal that is outwardly protruding from a mold resin member. This structure is useful in a case that the radiating member becomes large and a distance between a control electrode of the semiconductor switching element and the peripheral surface of the radiating member becomes long. Namely, by appropriately designing the conductive layer, electrical connection is easily secured between the semiconductor chip and the signal terminal.

BRIEF DESCRIPTION OF THE DRAWINGS

The above and other objects, features, and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
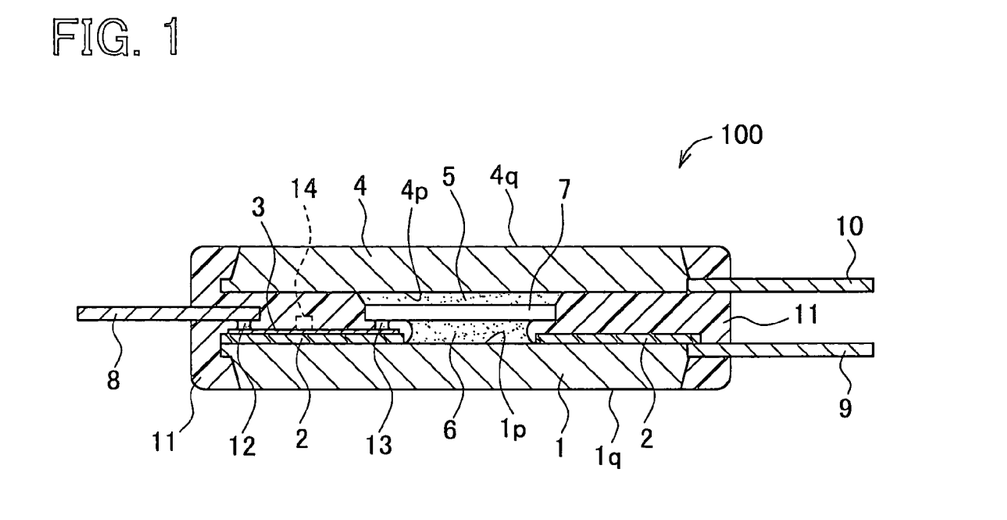
FIG. 1 is a sectional view of a schematic structure of a power element package according to a first embodiment of the present invention.

The present invention is directed to a power element package as a semiconductor device. Referring to FIG. 1, a power element package 100 of a first embodiment of the present invention is a package where a semiconductor switching element 7 (hereinafter "semiconductor chip") is sandwiched between radiating members 1, 4 and integrated with them. For instance, this power element package 100 constitutes a part of a three-phase inverter circuit for a brushless motor. The semiconductor chip 7 includes, e.g., an IGBT (Insulated Gate Bipolar Transistor) or a power MOSFET. The IGBT connected with inductive load such as a motor is parallelly connected with a reversed free wheel diode (not shown in FIG. 1).

The power element package 100 includes a semiconductor chip 7, radiating members 1, 4, a mold resin member 11, a lead terminal 8 for control signals, and lead terminals 9, 10 for large electric current. The semiconductor chip 7 is electrically connected with the radiating members 1, 4 through solder connection members 5, 6. On a heat accepting surface 1p of the radiating member 1, an insulating layer 2 and a conductive layer 3 are disposed. The lead terminal 8 for control signals is electrically connected with a gate 7g of the semiconductor chip 7 through the conductive layer 3.

Figure 2:
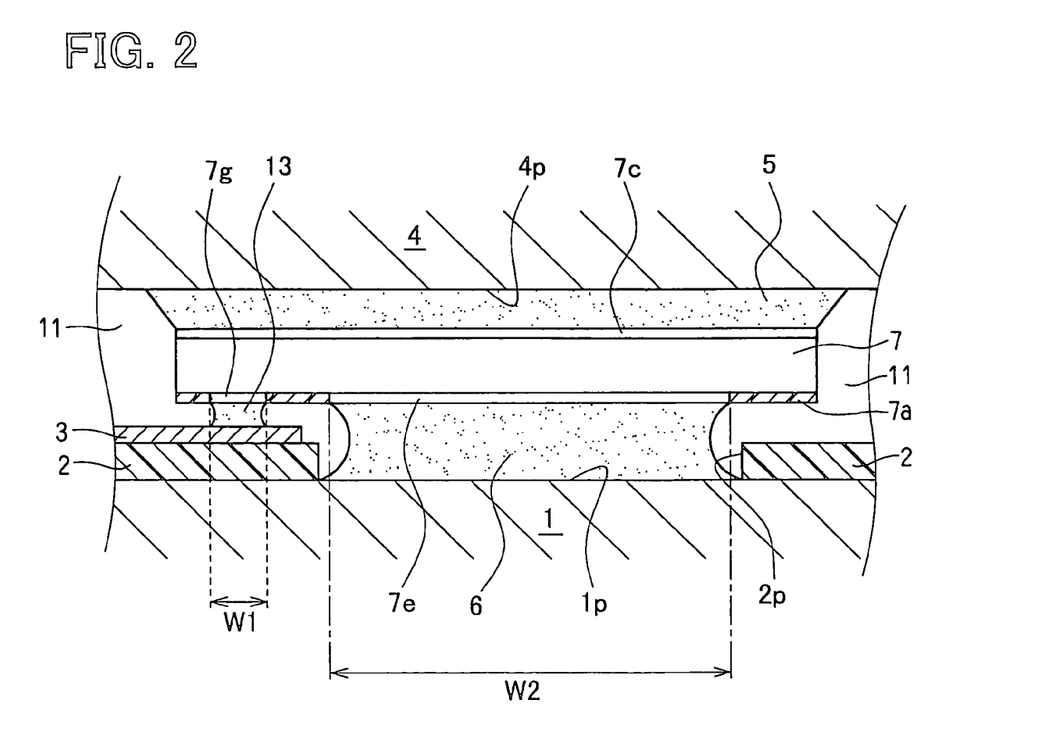
FIG. 2 is an enlarged view of a main part in FIG. 1.

As shown in an enlarged main part in FIG. 2, the semiconductor chip 7 of a thin plate shape has an exposed gate 7g and an exposed emitter 7e (or source) on a first surface of its own, and has a collector 7c (or drain) in an opposite second surface. The gate 7g, emitter 7e, and collector 7c are applied with the surface treatment such as Ni—Au plating for enhancing wetting with the solder. The first surface of the semiconductor chip 7 has the non-exposed area excluding the gate 7g and the emitter 7e, the non-exposed area which is coated by an insulating protection film 7a such as a polyimide resin. By contrast, the second surface has the exposed collector 7c being larger than the emitter 7e.

As explained above, the pair of radiating members 1, 4 is disposed as sandwiching the semiconductor 7. The emitter 7e of the semiconductor 7 is electrically connected with the radiating member 1 of the pair through the solder connection member 6. By contrast, the collector 7c is electrically connected with the other radiating member 4 through the solder connection member 5. With respect to the solder connection members 5, 6, their solder amounts are controlled such that the solder connection members coat the entire surfaces of the collector 7c and emitter 7e. The solder as a conductive connection member can be replaced with a known Ag brazing material.

The radiating members 1, 4 have compressed or plate shapes; each has an inward heat accepting surface 1p, 4p and an outward heat radiating surface 1q, 4q, both of which are substantially plane and parallel with each other. The dimensions of the heat accepting surfaces 1p, 4p and radiating surfaces 1q, 4q are much larger than those of the surfaces of the semiconductor chip 7. This increases cooling capability to thereby control the thermal resistance of the power element package 100 for being small. The radiating member 1, 4 is favorably formed of a pure metal selected from a group of Cu, W, Mo, and Al or an alloy that is mainly composed of the metals selected from the group from the view point of thermal and electrical conductivity.

Further, a mold resin member 11 is formed so as to cover or coat the peripheral sides of the semiconductor chip 7 and filling the space formed by the radiating members 1, 4. The mold resin member 11 is formed of, e.g., an epoxy resin. The radiating member 1 is integrated with the lead terminal 9 for large electric current outwardly protruding from the mold resin member 11, while the radiating member 4 is integrated with the lead terminal 10 for large electric current outwardly protruding from the mold resin member 11, as shown in FIG. 1.

The semiconductor chip 7 is disposed between the radiating members approximately in a center position in a lateral direction (rightward-leftward direction in FIG. 1); therefore, a distance to the periphery of the mold resin member 11 is relatively long. Wire bonding between the gate 7g of the semiconductor chip 7 and the lead terminal 8 for control signals thereby has a problem in reliability. Here, the wire bonding is for supplying the control signals (channel switching signals) from the lead terminal 8 to the gate 7g.

In the present invention, the conductive layer 3 functions as a relaying wiring between the gate 7g and the lead terminal 8; the conductive layer 3 is formed on the heat accepting member 1p of the radiating member 1 via the insulating layer 2. The lead terminal 8 for control signals is a strip-shaped or linear member of a highly conductive metal material such as copper or copper alloy.

As shown in FIGS. 1, 2, of the semiconductor chip 7, the first surface where the exposed gate 7b faces the conductive layer 3. The exposed area W1 of the gate 7g overlaps with the conductive layer 3, while the exposed area W2 of the emitter 7e overlaps with the portion (non-insulating portion) of the radiating member 1 where no insulating layer 2 is formed on the radiating member 1. Namely, the solder connection member 13 directly connects the gate 7g with the conductive layer 3; the solder connection member 6 that is located on the non-insulating portion of the radiating member 1 directly connects the emitter 7e with the radiating member 1.

Figure 3:
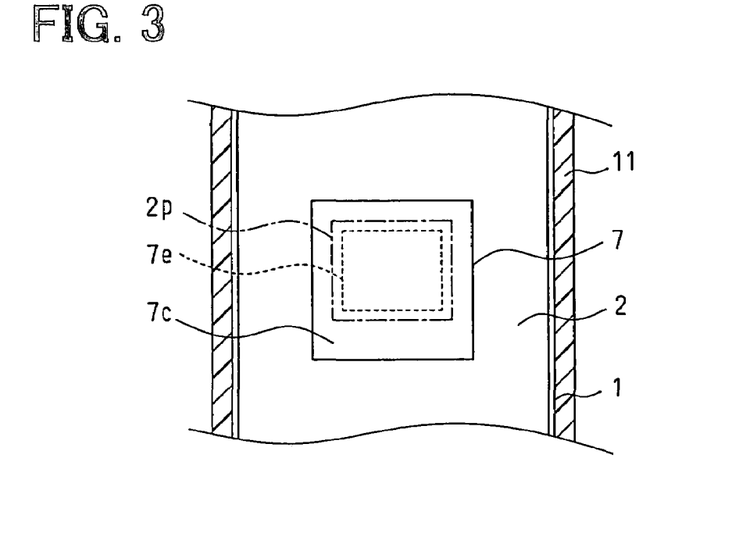
FIG. 3 is a plan view showing a relative position between an insulating layer and a semiconductor chip.

The relative position of the semiconductor chip 7 and the insulating layer 2 that is formed on the radiating member 1 is shown in FIG. 3. The insulating layer 2 has an opening 2p for accommodating the solder connection member 6. As shown in FIG. 3, the area of the emitter 7e of the semiconductor chip 7 is within that of the opening 2p. Namely, in an overhead view as shown in FIG. 3, an area of the opening 2p surrounds an area of the area of the emitter 7e. This maximally secures the thermal and electrical conductivity via the solder connection member 6. Further, this restricts the solder outflow to an outside of the opening 2p when reflow soldering is performed. In addition, the surface of the semiconductor chip 7 is coated by the insulating protection film 7a that is less wet with the solder, so that the solder is prevented from flowing over the area of the opening 2p when the reflow soldering is performed.

The insulating layer 2 is formed of a heat resisting resin preferably having a higher heat resisting temperature (thermal decomposition start temperature) than the reachable temperature (approximately 260° C. in the typical lead flow soldering) in the reflow soldering. This is required in the view of preventing insulation deterioration during the reflow soldering or aged insulation deterioration. In detail, a polyamide resin is a suitable material for the insulating layer 2. The thickness of the insulating layer 2 needs to be greater than 10 μm for securing the insulation. The insulating layer 2 is formed by attaching a resin film on the heat accepting surface 1p of the radiating member 1, the resin film where the opening 2p is previously formed.

The conductive layer 3 is favorably formed by pattern wiring of high conductive material such as copper or copper alloy. The pattern wiring is relatively easily formed on the insulating layer, so that manufacturing costs can be reduced. The thickness of the conductive layer 3 needs to be greater than 20 μm for securing the appropriate connection with the soldering. The conductive layer 3 is formed by attaching a copper foil on the insulating layer 2 and then pattern etching the cupper foil. Otherwise, it can be also formed by pattern metal plating.

The thickness of the soldering connection member 6 is controlled for being 80 to 150 μm posterior to the reflow soldering. When the thickness exceeds 150 μm, the control of the solder amount becomes difficult, which may involve a short-circuit between the gate 7g and emitter 7e. Further, the semiconductor chip 7 is potentially fixed such that the semiconductor chip 7 inclines to a large extent against both the radiating members 1, 4, so that the thickness of the soldering connection member 6 is favorably from 80 to 150 μm, as assumed from FIG. 2.

As shown in FIG. 1, of the lead terminal 8 for control signals electrically connecting the gate 7g via the conductive layer 3, one end is protruding from the periphery of the mold resin member 11. By contrast, the other end is contained within the mold resin member 11 and electrically connected with the conductive layer 3 via the solder connection member 12. The conductive layer 3 and the lead terminal 8 can be previously integrated and the conductive layer 3 can be an input section to the gate 7g. Further lead terminals are sometimes provided for, other than the control signals, temperature detection, reference voltage detection, or electric current detection, which are eliminated for simplifying.

As explained above, in the power element package 100, eliminating the bonding wire results in decrease of space in a vertical direction in FIG. 1. In detail, a spacer inserted between the semiconductor chip 7 and the radiating member 4 can be eliminated. This spacer is for producing a space that a bonding wire passes through. No intervening spacer enhances thermal conductivity from the semiconductor chip 7 to either of the radiating members 1, 4, and accuracy of the relative position between the semiconductor chip 7 and either radiating member 1, 4. Further, an expensive wire bonding machine can be thereby unnecessary. Furthermore, using a proper tool enables the reflow soldering to be completed only once.

Further, when the insulating layer 2 and the conductive layer 3 are provided, a component 14 such as an IC, a resistor, or a capacitor can be also disposed on the insulating layer 2, as shown in a dotted line in FIG. 1. When, in an overhead view, the insulating layer 2 is disposed such that the insulating layer 2 surrounds the semiconductor chip 7, an area for the component can be favorably obtained.

Second Embodiment

Figure 4:
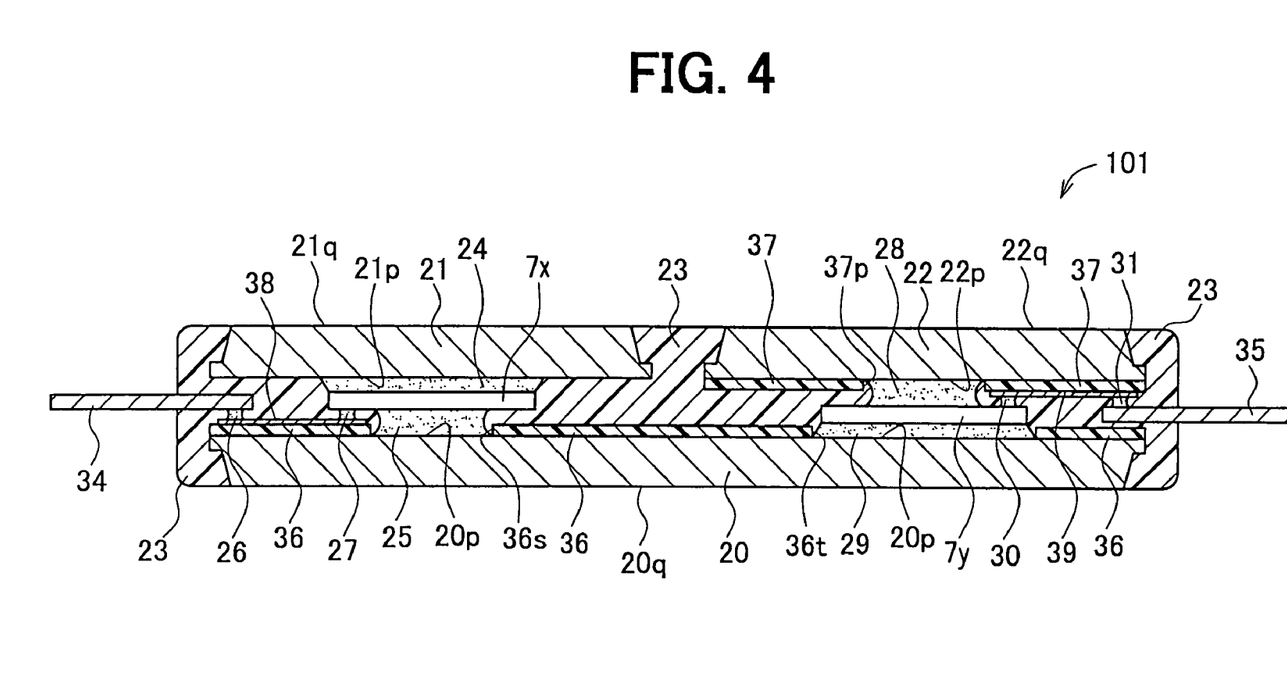
FIG. 4 is a sectional view of a schematic structure of a power element package according to a second embodiment of the present invention.
Figure 5:
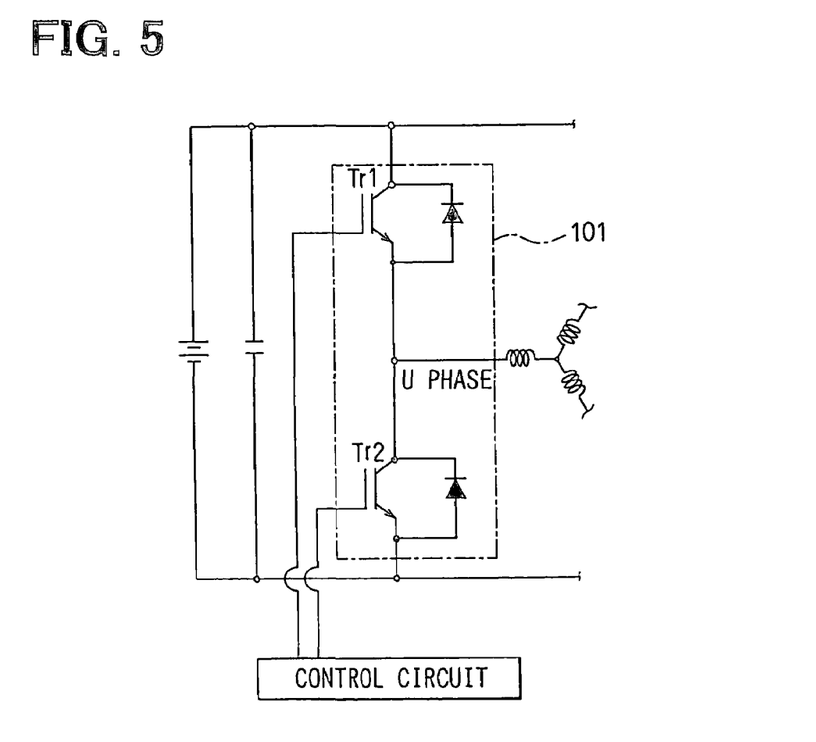
FIG. 5 is a diagram of an equivalent circuit of the power element package of the second embodiment.

As shown in FIG. 4, a power element package 101 of a second embodiment has a structure where two power element packages 100 shown in FIG. 1 are combined. Here, two upper and lower arms of an inverter shown in FIG. 5 are formed by a single package. This possibly decreases the cost owing to decrease of the number of components in comparison with the two packages each has an individual semiconductor chip. Further, this enhances easiness of assembling the power element packages with each other when an inverter module is fabricated. Here, the free wheel diode is not shown in FIG. 4. Most explanation for this embodiment is the same as that of the first embodiment, so that only the difference from the first embodiment will be explained below.

The power element package 101 includes a pair of semiconductor chips 7x, 7y having circuits equivalent to each other; individual radiating members 21, 22 corresponding to the semiconductor chips 7x, 7y, respectively; a radiating member 20 used in common for both the semiconductor chips 7x, 7y; a mold resin member 23 that covers the peripheral sides of the chips 7x, 7y and fills the space formed by the radiating members 20, 21, 22. The radiating members 21, 22 can be formed of the same member. The semiconductor chip 7x and the semiconductor chip 7y are disposed such that both are apart from each other horizontally in FIG. 4 so that both never overlap vertically in FIG. 4.

The semiconductor chip 7x disposed between the radiating members 20, 21 are directly connected with the radiating members 20, 21 using the solder connection members 24, 25. By contrast, the semiconductor chip 7y disposed between the radiating members 20, 22 are directly connected with the radiating members 20, 22 using the solder connection members 28, 29. Here, the semiconductor chip 7y is disposed so that the front and rear surfaces of the semiconductor chip 7y is reverse to those of the semiconductor chip 7x. Namely, a top and bottom relationship with respect to the front and rear surfaces (or the first and second surfaces) of the semiconductor chip 7x is reverse to that of the semiconductor chip 7y. Therefore, the emitter of the semiconductor chip 7x is electrically connected with the collector of the semiconductor 7y via the radiating member 20, so that two IGBTs are serially connected. The forming structure of the gate, emitter, and collector are equivalent to that in FIG. 2.

As shown in FIG. 5, when a three-phase inverter circuit is formed of parallelly connected power element packages 101, the radiating member 20 used in common for the semiconductor chips 7x, 7y functions as a middle electrode connected with a load such as a motor. This structure decreases parasitic inductance possessed by the middle electrode to thereby decrease noise or off-surge.

The common use radiating member 20 has an inward heat accepting surface 20p and an outward radiating surface 20q. On the heat accepting surface 20p, an insulating layer 36 and conductive layer 38 are disposed. The insulating layer 36 has openings 36s, 36t within which solder connection members 25, 29 are formed. On the surface facing the radiating member 20, the semiconductor chip 7x has a gate whose exposed gate area is overlapped and electrically connected with the conductive layer 38 using a solder connection member 27.

The radiating members 21, 22 have inward heat accepting surfaces 21p, 22p and outward radiating surfaces 21q, 22q, respectively. On the heat accepting surface 22p of the radiating member 22, an insulating layer 37 and conductive layer 39 are disposed. The insulating layer 37 has an opening 37p within which a solder connection member 28 is formed. On the surface connected with the radiating member 22, the semiconductor chip 7y has a gate whose exposed gate area is overlapped and electrically connected with the conductive layer 39 using a solder connection member 30.

The above conductive layers 38, 39 are connected with ends of the control signal lead terminals 34, 35 via solder connection members 26, 31, respectively; the other ends of the control signal lead terminals 34, 35 outwardly protrude from the mold resin member 23, respectively. Each of the radiating members 20, 21, 22 is integrated with a large current lead terminal (not shown).

Third Embodiment

Figure 6:
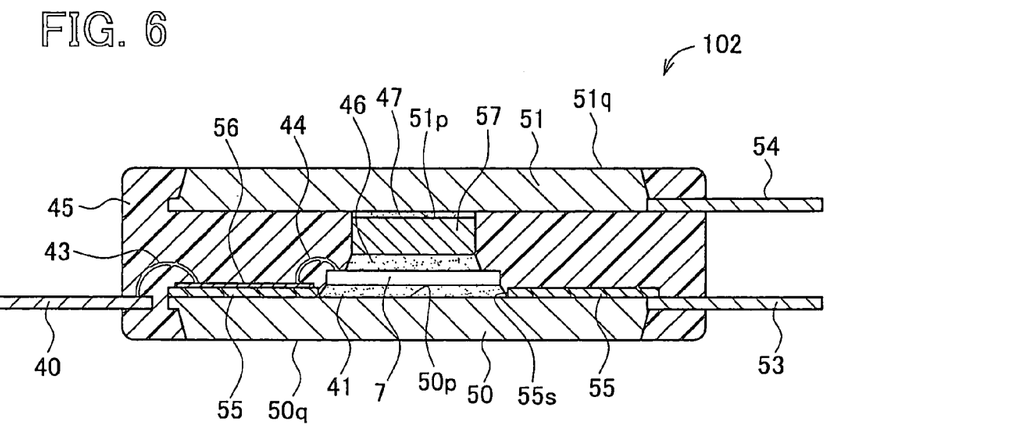
FIG. 6 is a sectional view of a schematic structure of a power element package according to a third embodiment of the present invention.

As shown in FIG. 6, a power element package 102 of a third embodiment has a structure where large dimensioned radiating members are disposed even with wire bonding connection. Here, the power element package 102 includes a semiconductor chip 7; radiating members 50, 51 sandwiching the semiconductor chip 7; a mold resin member 45 that covers the peripheral sides of the chip 7 and fills the space formed by the radiating members 50, 51. The radiating members 50, 51 are integrated with large current lead terminals 53, 54, respectively.

On its surface reverse to the surface where the gate is exposed, the semiconductor chip 7 is directly connected with the radiating member 50 via a solder connection member 41. On the surface where the gate is exposed, the semiconductor chip 7 is connected with the radiating member 51 via a spacer 57 and solder connection members 46, 47. The solder connection member 46 connects the semiconductor chip 7 and the spacer 57, while the solder connection member 47 connects the spacer 57 and the radiating member 51.

The radiating members 50, 51 have inward heat accepting surfaces 50p, 51p and outward radiating surfaces 50q, 51q, respectively. On the heat accepting surface 50p of the radiating member 50, an insulating layer 55 is disposed. The insulating layer 55 has an opening 55s within which the semiconductor chip can be accommodated. The insulating layer 55 is thereby disposed so that the insulating layer 55 looks surrounding the semiconductor chip 7 in an overhead view from above in FIG. 6.

On the insulating layer 55, a conductive layer 56 is formed. The gate 7g of the semiconductor chip 7 (refer to FIG. 2) is formed on the surface opposite to the surface which the radiating member 50 faces. The gate 7g is connected with the end surface of the conductive layer 56 via a bonding wire 44; the other end surface of the conductive layer 56 is connected with a lead terminal 40 for control signals via a bonding wire 43. The lead terminal 40 extends from the peripheral of the mold resin member 45. In this structure, the bonding wires 43, 44 can be formed within a length securing reliability of the connection using the conductive layer 56 that supplements the connection length. Further, the lead terminal 40 for control signals can easily extend outwardly from the mold resin member 45.

Figure 7:
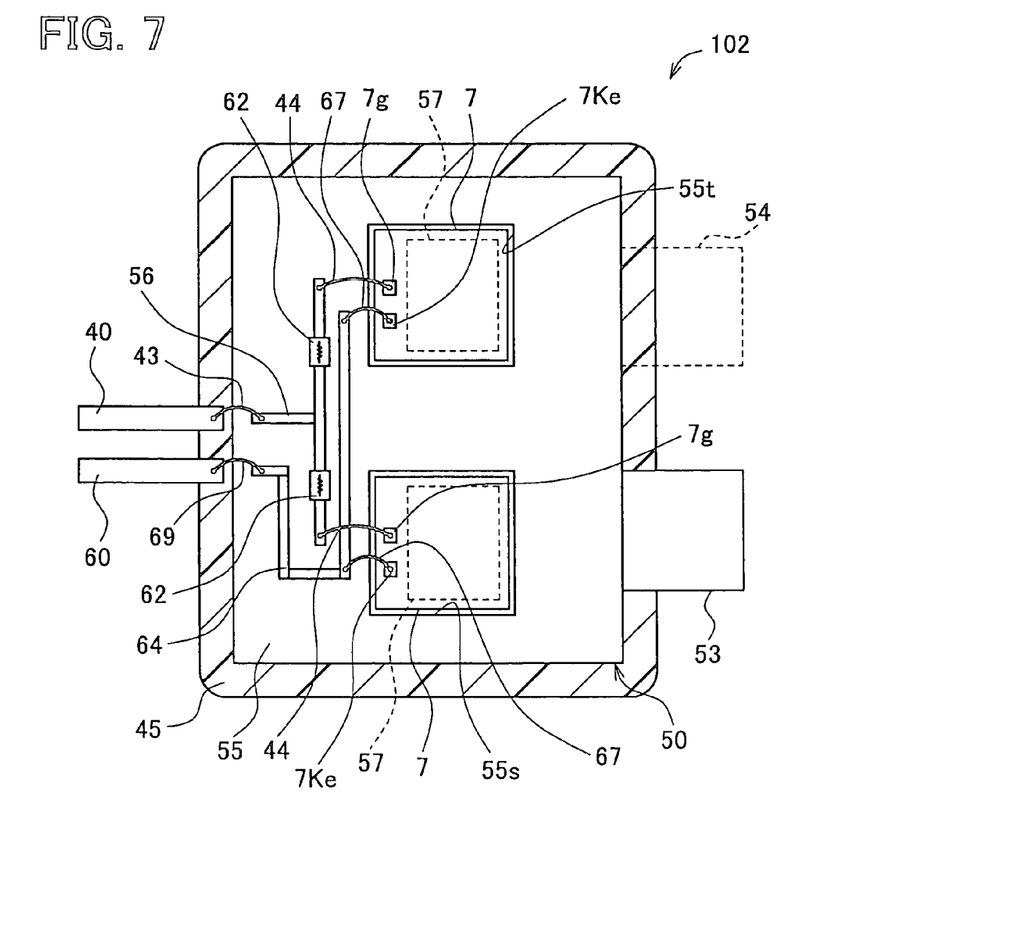
FIG. 7 is a decomposed plan view of the power element package of the third embodiment.

FIG. 7 shows a decomposed plan view of the power element package 102; namely, multiple equivalent semiconductor chips 7, 7 are parallelly disposed to be molded and integrated by a resin. This structure is suitable for switching much large electric current. Here, the mold resin member 45 fixes and integrates the individual semiconductor switching elements 7, 7 and radiating members 50, 51.

As shown in FIG. 7, the individual semiconductor chips 7, 7 use in common the radiating members 50, 51. The front and rear (emitter and collector) surfaces of both the chips 7, 7 are similarly disposed and both are disposed to be aligned as shown in the plan view in FIG. 7. Namely, top and bottom relationships with respect to the front and rear surfaces of both the chips 7, 7 are the same. Therefore, the two semiconductor chips 7, 7 are parallelly connected. The insulating member 55 formed on the radiating member 50 has openings 55s, 55t whose number is the same number of the semiconductor chips 7, 7 that are integrated by the mold resin member 45.

The semiconductor chips 7, 7 are supplied with the control signals through the gates 7g, 7g from the single lead terminal 40 for control signals. In detail, the conductive layer 56 that connects with the lead terminal 40 branches, so that the control signals are supplied to the semiconductor chips 7, 7 whose number (two in this embodiment) is larger than that of the lead terminal 40. Namely, the control signal line branches within the package.

Further, resistors 62, 62 disposed on the conductive layer 56 are used as balance resistors for preventing difference in a switching speed owing to deviation between the semiconductor chips 7, 7 and for stabilizing operation. It is supposed that multiple semiconductor chips 7, 7 are parallelly connected mutually to be integrated as a package. Here, adopting the structure of the present invention where an insulating layer and conductive layer are formed on a radiating member enables resistors 62, 62 to be easily provided. In addition, an emitter 7 Ke shown in FIG. 7 is a reference voltage electrode for electrically connecting with bonding wires 67, 67, a conductive layer 64, a bonding wire 69, and a lead terminal 60 for detecting the reference voltage.

Further, as shown in FIG. 7, the insulating layer 55 is formed as surrounding the semiconductor chips 7, 7, it has much room for other uses. The conductive layers. 56, 64 of the wiring pattern can be therefore suitably modified. For instance, extending directions of the lead terminals 40, 60 from the mold resin member 45 can be differentiated. Further, room for the resistors 62, 62 can be sufficiently obtained.

Fourth Embodiment

Figure 8:
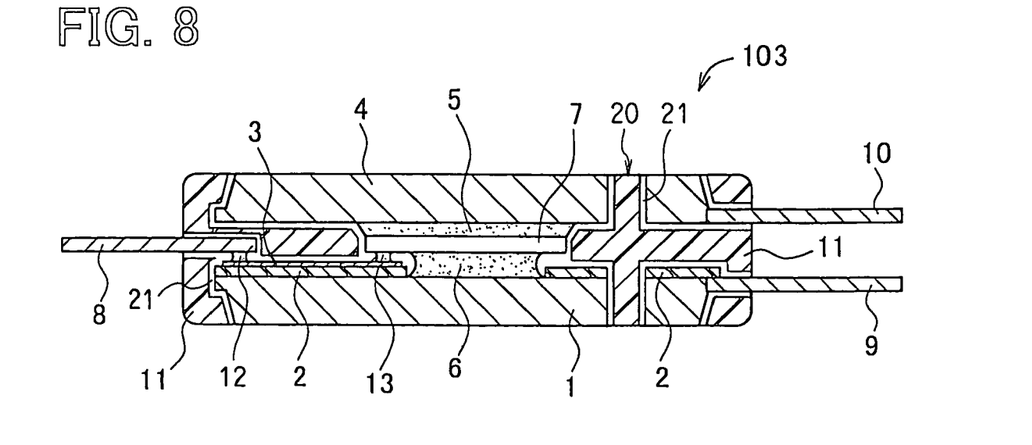
FIG. 8 is a sectional view of a power element package of a fourth embodiment of the present invention.

A power element package 103 as a fourth embodiment will be explained in comparison with the first embodiment using FIG. 8. Here, radiating members 1, 4 have holes 20; a polyamide resin 21 is applied between the radiating members 1, 4 and mold resin member 11. These features are for enhancing adhesion between the radiating members 1, 4 and the mold resin member 11. These features can be also applied to the second and third embodiments.

Fifth Embodiment

Figure 9:
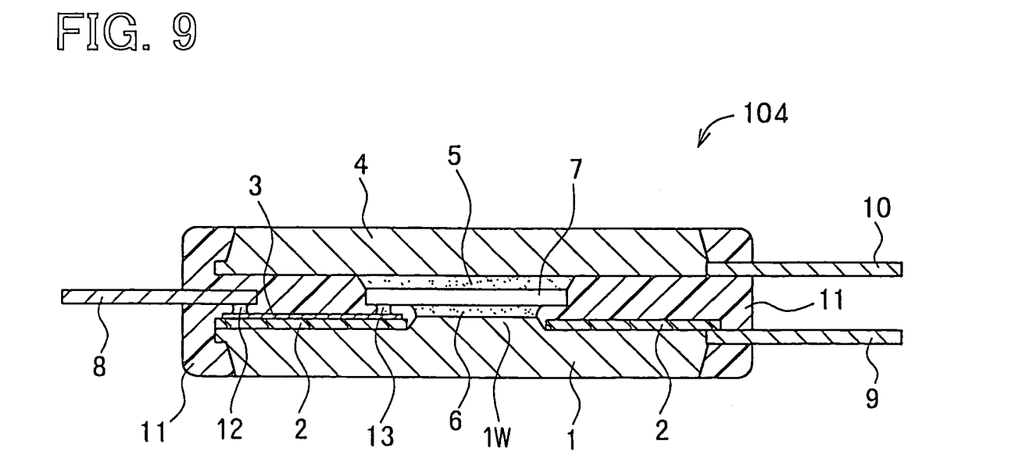
FIG. 9 is a sectional view of a power element package of a fifth embodiment of the present invention.

A power element package 104 as a fifth embodiment will be explained in comparison with the first embodiment using FIG. 9. Here, a radiating member 1 has a convex portion (or protruding portion) 1w which connects with the semiconductor chip 7 via a solder connection member 6. Further, a solder connection member 13 is between a control terminal of a semiconductor chip 7 and a conductive layer 3; the solder connection member 6 is between a primary electrode of the semiconductor chip 7 and the radiating member 1. This structure enables the amounts of solder connection members 6, 13 to be properly controlled, hindering the solder from flowing out from the primary electrode of the semiconductor chip 7. Therefore, a defective fraction in the soldering process can be reduced and operability can be enhanced. This feature can be also applied to the second embodiment.

Sixth Embodiment

Figure 10:
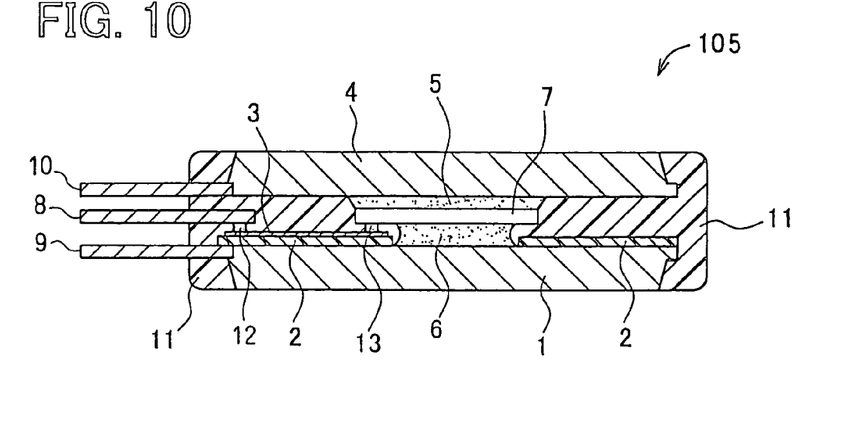
FIG. 10 is a sectional view of a power element package of a sixth embodiment of the present invention.

A power element package 105 as a sixth embodiment will be explained in comparison with the first embodiment using FIG. 10. Here, lead terminals 9, 10 for electric current output are disposed in the same side of the package 105 along with a lead terminal 8 for control signals. Depending on packaging types, it is preferable that the same side of the package has the lead terminals 9, 10 for current output along with the lead terminal 8 for control signals. This feature can be also applied to the second and third embodiments.

Seventh Embodiment

Figure 11:
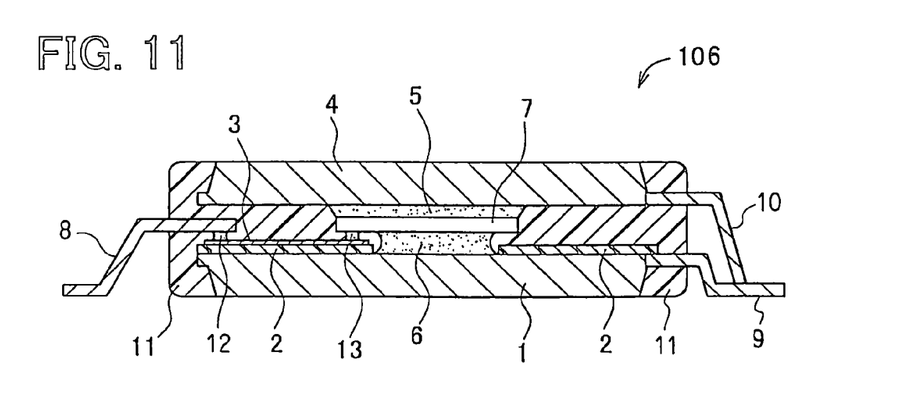
FIG. 11 is a sectional view of a power element package of a seventh embodiment of the present invention.

A power element package 106 as a sixth embodiment will be explained in comparison with the first embodiment using FIG. 11. Here, lead terminals 9, 10 for electric current output along with a lead terminal 8 for control signals are bent for being appropriate to surface mounting. This feature can be also applied to the second and third embodiments.

Eighth Embodiment

Figure 12:
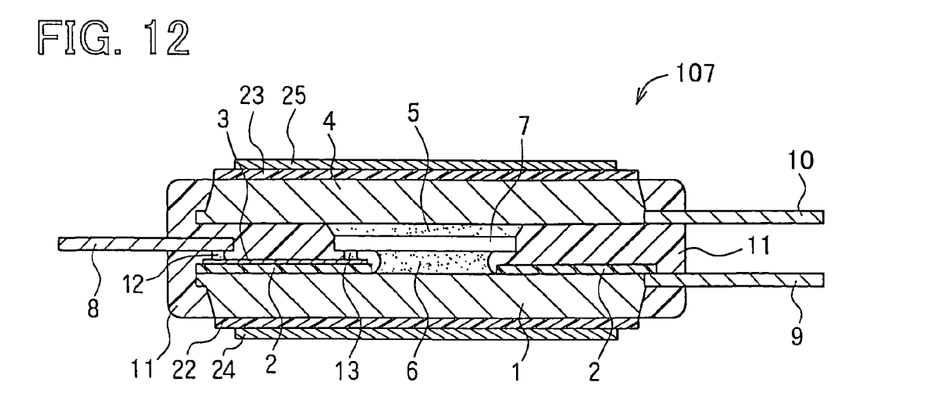
FIG. 12 is a sectional view of a power element package of an eighth embodiment of the present invention.

A power element package 107 as a sixth embodiment will be explained in comparison with the first embodiment using FIG. 12. Radiating members 1, 4 are outwardly connected with insulating layers 22, 23, respectively. The insulating layers 22, 23 are then outwardly connected with metal layers 24, 25, respectively. Typically, a package of the present invention is installed such that its radiating member adjoins a cooling unit, needing insulation between the radiating member and the cooling unit. In this embodiment, this insulation is previously formed on the package as the insulating layers 22, 23. Further, the metal layers 24, 25 such as copper function as a protection layer for the insulating layers 22, 23. This feature can be also applied to the second and third embodiments.

It will be obvious to those skilled in the art that various changes may be made in the above-described embodiments of the present invention. However, the scope of the present invention should be determined by the following claims.

What is claimed is:

1. A semiconductor device comprising:
   an element of a semiconductor switching element that includes first and second surfaces, wherein a first electrode is exposed on the first surface, a second electrode is exposed on the second surface, and a control electrode is exposed on a control-electrode-exposing surface that is one of the first and second surfaces;
   two radiating members between which the element is disposed, wherein the two radiating members are electrically connected with the first and second electrodes, respectively, wherein each of the two radiating members has an inward and outward surfaces, wherein the inward surface is closer to the element than the outward surface;
   a mold resin member filling a space between the two radiating members;
   an insulating layer formed on an insulated portion of at least one of the inward surfaces of the two radiating members; and
   a conductive layer formed on the insulating layer and electrically connected with the control electrode and an input portion protruding from the mold resin member, wherein
   one of the first and second electrodes is electrically connected with a non-insulating portion of the inward surface on which the insulated portion is located, wherein no insulating layer is formed on the non-insulating portion,
   the input portion includes a lead terminal for control signals, and
   a first end of the lead terminal is protruding from the mold resin member while a second end of the lead terminal is, with the conductive layer, overlapped and electrically connected using a conductive connection member.

2. The semiconductor device of claim 1, wherein the conductive layer includes a pattern wiring formed of at least one of copper and copper alloy.

3. The semiconductor device of claim 1, wherein the insulating layer is formed of a heat resisting resin.

4. A semiconductor device comprising:
   an element of a semiconductor switching element that includes first and second surfaces, wherein a first electrode is exposed on the first surface, a second electrode is exposed on the second surface, and a control electrode is exposed on a control-electrode-exposing surface that is one of the first and second surfaces;
   two radiating members between which the element is disposed, wherein the two radiating members are electrically connected with the first and second electrodes, respectively, wherein each of the two radiating members has an inward and outward surfaces, wherein the inward surface is closer to the element than the outward surface;
   a mold resin member filling a space between the two radiating members;
   an insulating layer formed on an insulated portion of at least one of the inward surfaces of the two radiating members; and
   a conductive layer formed on the insulating layer and electrically connected with the control electrode and an input portion protruding from the mold resin member, wherein
   one of the first and second electrodes is electrically connected with a non-insulating portion of the inward surface on which the insulated portion is located, wherein no insulating layer is formed on the non-insulating portion,
   one of the first and second electrodes that is exposed on the control-electrode-exposing surface is overlapped with the non-insulating portion of the inward surface,
   the non-insulating portion is formed as an opening of the insulating layer such that in an overhead view an area of the one of the first and second electrodes that is exposed on the control-electrode-exposing surface lies within the opening, and
   the one of the first and second electrodes that is exposed on the control-electrode-exposing surface is electrically connected with the non-insulating portion of the inward surface.

5. The semiconductor device of claim 1,
   wherein the element includes a first and second elements, both of which have circuits equivalent to each other,
   wherein a first radiating member of the two radiating members includes a certain first radiating member used for the first element and a given first radiating member used for the second element, wherein a second radiating member of the two radiating members is used in common for the first and second elements,
   wherein the mold resin member fixes the first and second elements and the first and second radiating members as one body,
   wherein the first and second elements are disposed with a gap therebetween in a direction of the surfaces of the first and second elements such that the surfaces of the first element is not overlapped with the surfaces of the second element, wherein a top and bottom relationship with respect to the first and second surfaces of the first element is reverse to that of the second element, wherein the first and second elements are electrically serially connected with each other,
   wherein the non-insulating portion includes a first non-insulating portion that is formed on the inward surface of the second radiating member and a second non-insulating portion that is formed on the inward surface of the given first radiating member,
   wherein the control electrode of the first element is, with the conductive layer formed over the second radiating member, overlapped and electrically connected using a conductive connection member, wherein one of the first and second electrodes that is exposed on the control-electrode-exposing surface of the first element is, with the first non-insulating portion of the second radiating member, overlapped and electrically connected using a conductive connection member, wherein one of the first and second electrodes that is exposed on a surface opposite to the control-electrode-exposing surface of the first element is electrically connected using a conductive connection member with the certain first radiating member, wherein the control electrode of the second element is, with the conductive layer formed over the given first radiating member, overlapped and electrically connected using a conductive connection member, wherein one of the first and second electrodes that is exposed on the control-electrode-exposing surface of the second element is, with the second non-insulating portion of the given first radiating member, overlapped and electrically connected with a conductive connection member, wherein one of the first and second electrodes that is exposed on a surface opposite to the control-electrode-exposing surface of the second element is electrically connected using a conductive connection member with the second radiating member, and wherein the second radiating member includes a middle electrode connected with a load including an inductive load.

6. The semiconductor device of claim 1, wherein the conductive layer is electrically connected using a bonding wire with the control electrode of the element, wherein the input portion includes a lead terminal for control signals, wherein a first end of the lead terminal is protruding from the mold resin member while a second end of the lead terminal is electrically connected using a bonding wire with the conductive layer, and wherein the bonding wires are covered by the mold resin member.

7. The semiconductor device of claim 6, wherein the element is one of a plurality of elements, wherein the plurality of elements are disposed with gaps therebetween in a direction of the surfaces of the elements such that a surface of one element is not overlapped with a surface of an adjacent element, wherein top and bottom relationships with respect to the first and second surfaces of the plurality of elements are same so that the plurality of elements are electrically parallelly connected mutually, and wherein the plurality of elements are electrically connected with at least one lead terminal via the conductive layer that branches to the plurality of elements such that a number of the plurality of elements is more than a number of the lead terminals.

8. The semiconductor device of claim 1, wherein at least one of the two radiating members includes a hole member where the mold resin member can be disposed, and wherein a polyamide resin is applied on a given surface of at least one of the two radiating members, the given surface can be in direct contact with the mold resin member.

9. The semiconductor device of claim 1, wherein the control-electrode-exposing surface of the element faces the conductive layer, wherein the control electrode is, with the conductive layer, overlapped and electrically connected using a conductive connection member, wherein one of the first and second electrodes that is exposed on the control-electrode-exposing surface is, with the non-insulating portion of the inward surface, overlapped and electrically connected using a conductive connection member, and wherein the non-insulating portion is protruding from the insulated portion.

10. A semiconductor device comprising:

an element of a semiconductor switching element that includes first and second surfaces, wherein a first electrode is exposed on the first surface, a second electrode is exposed on the second surface, and a control electrode is exposed on a control-electrode-exposing surface that is one of the first and second surfaces;

two radiating members between which the element is disposed, wherein the two radiating members are electrically connected with the first and second electrodes, respectively, wherein each of the two radiating members has an inward and outward surfaces, wherein the inward surface is closer to the element than the outward surface;

a mold resin member filling a space between the two radiating members;

an insulating layer formed on an insulated portion of at least one of the inward surfaces of the two radiating members; and a conductive layer formed on the insulating layer and electrically connected with the control electrode and an input portion protruding from the mold resin member, wherein one of the first and second electrodes is electrically connected with a non-insulating portion of the inward surface on which the insulated portion is located, wherein no insulating layer is formed on the non-insulating portion;

a first lead terminal whose first end is electrically connected with a first radiating member of the two radiating members and whose second end is outwardly protruding from the mold resin member;

a second lead terminal whose first end is electrically connected with a second radiating member of the two radiating members and whose second end is outwardly protruding from the mold resin member; and a third lead terminal that is included in the input portion, wherein a first end of the third lead terminal is outwardly protruding from the mold resin member while a second end of the third lead terminal is, with the conductive layer, overlapped and electrically connected using a conductive connection member.

11. The semiconductor device of claim 10, wherein the first and second lead terminals are outwardly protruding from a certain side of the mold resin member, and wherein the third lead terminal is outwardly protruding from a given side of the mold resin member, the given side is different from the certain side.

12. The semiconductor device of claim 10, wherein the first, second, and third lead terminals are outwardly protruding from one side of the mold resin member.

13. The semiconductor device of claim 10, wherein the three first ends of the first, second, and third lead terminals that are protruding from the mold resin member are being bent for being appropriate to surface mounting.

14. The semiconductor device of claim 1, wherein at least one of the two radiating members is outwardly connected with an additional insulating layer, and wherein the additional insulating layer is then outwardly connected with an additional conductive layer.

* * * * *